(12) United States Patent
Goto

(10) Patent No.: US 7,816,890 B2
(45) Date of Patent: Oct. 19, 2010

(54) SEMICONDUCTOR UNIT FOR PROTECTING SECONDARY BATTERY, BATTERY PACK HAVING THE SEMICONDUCTOR UNIT BUILT-IN AND ELECTRONIC APPARATUS USING IT

(75) Inventor: Tomoyuki Goto, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 149 days.

(21) Appl. No.: 12/091,981

(22) PCT Filed: Aug. 31, 2007

(86) PCT No.: PCT/JP2007/067467

§ 371 (c)(1),
(2), (4) Date: Apr. 29, 2008

(87) PCT Pub. No.: WO2008/032644

PCT Pub. Date: Mar. 20, 2008

(65) Prior Publication Data
US 2009/0121682 A1 May 14, 2009

(30) Foreign Application Priority Data

Sep. 13, 2006 (JP) .............................. 2006-247620

(51) Int. Cl.
*H02J 7/00* (2006.01)
(52) U.S. Cl. ..................................................... 320/134
(58) Field of Classification Search .................. 320/134
See application file for complete search history.

(56) References Cited

U.S. PATENT DOCUMENTS

| 6,373,227 | B2* | 4/2002 | Nakashimo | 320/134 |
| 7,486,051 | B2* | 2/2009 | Zhang | 320/136 |
| 2001/0026147 | A1* | 10/2001 | Nakashimo | 320/134 |
| 2005/0180067 | A1 | 8/2005 | Zhang | |
| 2008/0061743 | A1* | 3/2008 | Goto | 320/134 |

FOREIGN PATENT DOCUMENTS

| JP | 2002-186173 | 6/2002 |
| JP | 2005-12852 | 1/2005 |
| JP | 2005-229742 | 8/2005 |

* cited by examiner

*Primary Examiner*—Edward Tso
*Assistant Examiner*—Manuel Hernandez
(74) *Attorney, Agent, or Firm*—Cooper & Dunham LLP

(57) ABSTRACT

A semiconductor unit for protecting a secondary battery has a current detecting terminal converting a charging current to a negative voltage with respect to a negative electrode potential (ground potential) of the secondary battery when the secondary battery is charged, converting the charging current to a positive voltage with respect to the negative electrode potential (ground potential) of the secondary battery when the secondary battery is discharged, and detecting the charging/discharging current; and a test signal generating circuit generating a first test signal when the voltage of the current detecting terminal lowers to a first negative voltage which does not occur in a normal operation state of the semiconductor unit, and generating a second test signal when the voltage of the current detecting terminal lowers to a second negative voltage lower than the first negative voltage.

14 Claims, 10 Drawing Sheets

SEMICONDUCTOR UNIT FOR PROTECTING SECONDARY BATTERY, BATTERY PACK HAVING THE SEMICONDUCTOR UNIT BUILT-IN AND ELECTRONIC APPARATUS USING IT

TECHNICAL FIELD

The present invention relates to a semiconductor unit for protecting a secondary battery, and in particular, to a semiconductor unit for protecting a lithium ion battery, which a battery pack has built-in, of a secondary battery used in a portable electronic apparatus or such, from overcharge, overdischarge, charging overcurrent, discharging overcurrent, short circuit current or such, the battery pack having the semiconductor unit built-in, and the electronic apparatus.

It is noted that, throughout the specification and claims, an electric current is simply referred to as a current, and an electric potential is simply referred to as a potential.

BACKGROUND ART

In a portable electronic apparatus, a battery pack which is easily handled is wide used. The battery pack stores one or a plurality of secondary batteries in one package. As the secondary battery, one having a large capacity, such as a lithium ion battery, a lithium polymer battery, a nickel hydrogen battery, or such, is used. The large capacity battery has very large energy therein, and thus, it may heat, or in some case, it may burn, when overcharge, overdischarge, overcurrent or such occurs.

Therefore, a semiconductor unit for protecting the secondary battery is provided inside of the battery pack, for protecting the secondary battery from overcharge, overdischarge, charging overcurrent, discharging overcurrent, short circuit current or such, whereby, if actual protection is necessary, the semiconductor unit breaks connection between the secondary battery and a charger or a load apparatus, and thus, heating and burning is prevented.

The semiconductor unit for protecting the secondary battery has a special detecting circuit for detecting each of overcharge, overdischarge, charging overcurrent, discharging overcurrent, short circuit current and so forth. The detecting circuit outputs a detection signal when detecting such abnormality as that requiring protecting operation, turns off a switch device to break connection between the secondary battery and a charger or a load apparatus However, if a configuration is provided such that the switch device is immediately turned off when the detection signal is output, power supply to the load apparatus may be interrupted even by output of the detection signal which is merely within a very short time due to malfunction caused by noise or such, whereby a problem may occur such that the load apparatus may cause malfunction or such accordingly. In order to prevent such malfunction, commonly a configuration is provided such that determination is made that true abnormality has occurred only when abnormality continues even after a predetermined time has elapsed since the detection signal was output, and then, the switch device is turned off.

The above-mentioned predetermined time is called a 'delay time'. As the delay time, a different time (in a range between tens of milliseconds and seconds) is set depending on the particular contents of the abnormality detected. That is, the delay time is set shorter as the detected abnormality is of a higher degree or requires urgency. On the other hand, the delay time is set longer as the detected abnormality is of a lower degree or does not require urgency.

For example, the delay time for detecting overdischarge is on the order of 16 milliseconds, the delay time for detecting overcurrent is on the order of 10 milliseconds, the delay time for detecting short circuit is on the order of 1 millisecond. On the other hand, the delay time for detecting overcharge by means of an overcharge detecting circuit is equal to or larger than 1 second, or, at longest, it may be on the order of 5 seconds.

However, if the above-mentioned delay time should be waited for when such a semiconductor unit for protection a secondly battery is tested in an occasion of characteristic inspection, shipping inspection or such, the inspection requires a too long time, thus mass production effect may degrade, and thus, the cost may increase.

For the purpose of solving the problem, when such a semiconductor unit is tested, a test signal is applied to the semiconductor unit, whereby the delay time is shortened and thus, the test time is shortened. However, since such a semiconductor unit for protecting a secondary battery should be accommodated by a battery pack, it should be miniaturized. From this viewpoint, it is necessary to avoid such a situation that, one pin is added to provide a test terminal for the test signal, whereby an existing small package cannot accommodate the semiconductor unit and a larger package should be prepared therefor, or, the number of bonding pads increases for the test terminal, an IC chip size increases and thus, an extra space or an extra cost may arise.

Japanese Laid-Open Patent Application 2005-12852 discloses an art proposed by the present applicant, for the purpose of solving the above-mentioned problem. FIG. 6 shows a block diagram of a battery pack disclosed therein.

As shown in FIG. 6, the battery pack 20 includes a semiconductor unit 1 for protecting a secondary battery (in FIG. 6, an internal configuration is not shown), the secondary battery 21, a discharge control NMOS transistor M21, a charge control NMOS transistor M22, a capacitor C21 and resistors R21 and R22, and has a plus terminal 22 and a minus terminal 23. To the plus terminal 22 and the minus terminal 23, a charger 30 (when the secondary battery 21 is charged) or a load apparatus 30 (when the secondary battery 21 is discharged) is connected.

The semiconductor unit 1 has a current detecting terminal V− for detecting a discharging overcurrent or a charging overcurrent. A voltage of the current detecting terminal V− with respect to a terminal Vss is a plus voltage upon discharging and is a minus voltage upon charging.

In the art disclosed by Japanese Laid-Open Patent Application 2005-12852, such a function is provided that, when a negative voltage, lower than a negative voltage occurring from a normal charging overcurrent, is applied to the current detecting terminal V−, the delay time is reduced. Thereby, the above-mentioned test terminal required in the above-mentioned prior art can be omitted, and thus, it is possible to avoid increase in the package size and increases in the chip size.

A delay circuit provided in the semiconductor unit 1 has an oscillating circuit shown in FIG. 8, and a counter circuit for counting clock pulses of a clock signal CLK generated by the oscillating circuit. The oscillating circuit is a ring oscillating circuit including inverter circuits 41 through 45 as shown in FIG. 8.

Setting of an oscillation frequency in the ring oscillating circuit utilize times required for charging/discharging capacitors C1 and C2 at the outputs of the constant current inverters 41 and 44. The oscillation frequency of the ring oscillating circuit can be increased as a result of constant current values from constant current sources I1 through I4 of the constant current inverters 41 and 44 being substantially increased. In a test mode, the oscillation frequency of the oscillating circuit is increased as a result of the constant current values applied to the constant current inverters 41 and 44 being increased, and thus, the delay time is shortened accordingly. Below, specific operation thereof will be described with reference to FIG. 8.

In regular operation, a test signal TEST has a high level, and PMOS transistors M1 and M2 are turned off. Thereby, currents from current sources I3 and I4 are not supplied to the constant current inverters 41 and 44, and thus, charging/discharging of the capacitors C1 and C2 is carried out only by the constant current sources I1 and I2. As a result, times for the charging/discharging increase, and thus, the oscillation frequency lowers.

In contrast thereto, in a testing occasion, a low level is applied to the test signal TEST, and thus, the PMOS transistors M1 and M2 are turned on. Thereby, currents from the constant current sources I3 and I4 are also supplied to the constant current inverters 41 and 44. As a result, charging/discharging of the capacitor C1 is carried out by a sum current of the currents from the constant current sources I1 and I3. In the same manner, charging/discharging of the capacitor C2 is carried out by a sum current of the currents from the constant current sources I2 and I4. As a result, times required for charging/discharging the capacitors C1 and C2 are shortened, and thus, the oscillation frequency increases. As a result, the delay time is shortened as mentioned above.

However, for the oscillating circuit, the frequency of the clock signal may not be accurately set. This is because, due to process variation, the current values of the constant current sources I1 through I4, and capacitances of the capacitors C1 and C2 may vary.

Further, a ratio between the oscillation frequency in the testing occasion and the oscillation frequency in the regular operation may have process variation. When this ratio is increased, the variation in the ratio increases accordingly. As a result, the ratio between the low clock frequency in the regular operation and the high clock frequency in the testing occasion may not be set accurately, and thus, in the test with the use of the high clock frequency, a test time may vary for each product of the semiconductor unit.

In order to solve the problem, the present applicant proposed an improved counter circuit (in Japanese Patent Application No. 2006-245021) as shown in FIG. 7. This counter circuit 12 shows in FIG. 7 has such a configuration that a plurality of flip-flop circuits FF1 through FFn are connected in a cascade manner for inputting the clock signal CLK and counting the number of clock pulses. A signal inverted from an output of a flip-flop circuit in the last stage or a predetermined stage of the counter circuit 12 is used as a delay time signal. Also, in a testing occasion for the semiconductor unit with using this delay circuit (i.e., when the first test signal TEST1 is in the low level, which means an active state, i.e., low active or negative logic), the delay time generated with the use of an output signal from a flip-flop circuit in the first stage or a stage close to the first stage is used. Thus, the delay time can be shortened. As a result, it is possible to shorten the delay time without increasing the oscillation frequency.

However, in the circuit of FIG. 7, in the testing occasion, since only the flip-flop circuits up to those used for generating the above-mentioned shortened delay time are used, it is necessary to separately carry out a test as to whether or not the flip-flop circuits subsequent thereto operate properly.

For this purpose, operation check of all the flip-flop circuits FF1 through FFn of the counter circuit 12 of the delay circuit is carried out within a reduced time, as a result of, in response to another test signal (referred to as a second test signal TEST2) than the first test signal TEST1, the oscillation frequency of the oscillation circuit being increased, as described above with reference to FIG. 8. That is, in this case, as the test signal TEST shown in FIG. 8, the above-mentioned second test signal TEST2 is applied.

That is, for example, when the entire semiconductor unit 1 including the delay circuit (including the counter circuit 12 and the oscillating circuit 13) is tested, the first test signal TEST1 may be made active (i.e., to have the low level) with the second test signal TEST2 non-active (i.e., to have a high level), while, when particularly the delay circuit (including the counter circuit 12 and the oscillating circuit 13) is tested, the second test signal TEST2 may be made active (i.e., to have the low level) with the first test signal TEST1 non-active (i.e., to have the high level).

Thereby, when the entire semiconductor unit 1 is tested, the oscillating circuit 13 operates with the normal oscillation frequency, and the counter circuit 12 generates the shortened delay time as a result of the output of the flip-flop circuit in the first stage or the predetermined stage close thereto being used as mentioned above. On the other hand, when particularly the delay circuit is tested, the oscillating circuit 13 operates with the increased oscillation frequency as a result of the charging/discharging currents being increased as mentioned above, and the counter circuit 12 uses the output of the flip-flop circuit in the last stage or the predetermined stage as mentioned above whereby all the flip-flop circuits FF1 through FFn can be tested at once in this case.

However, as mentioned above, adding a new terminal for applying the second test signal TEST2 to the semiconductor unit 1 is not preferable from a viewpoint of miniaturization.

BRIEF SUMMARY

In an aspect of this disclosure, there is provided a semiconductor unit for protecting a secondary battery in which, no new terminal is required to be added to the semiconductor unit, and the second test signal can be generated inside of the semiconductor unit, a battery having the semiconductor unit built-in, and an electronic apparatus using the battery pack.

In another aspect, a semiconductor unit for protecting a secondary battery by detecting overcharge, overdischarge, charging overcurrent, discharging overcurrent or short circuit current, has a current detecting terminal converting a charging current to a negative voltage with respect to a negative electrode potential (ground potential) of the secondary battery when the secondary battery is charged, converting the discharging current to a positive voltage with respect to the negative electrode potential of the secondary battery when the secondary battery is discharged, and detecting the charging/discharging current; and a test signal generating circuit generating a first test signal when the voltage of the current detecting terminal lowers to a first negative voltage which does not occur in a normal operation state of the semiconductor unit, and generating a second test signal when the voltage of the current detecting terminal lowers to a second negative voltage lower than the first negative voltage.

In this configuration, the two test signals, i.e., the first test signal and the second test signal, are generated from the value of the negative voltage applied to the current detecting terminal V−. As a result, it is possible to carry out different two tests without newly adding a terminal for testing.

BRIEF DESCRIPTION OF DRAWINGS

Other aspects, features and advantages will become more apparent from the following detailed description when read in conjunction with the accompanying drawings.

DESCRIPTION OF REFERENCE NUMERALS

Figure 1:
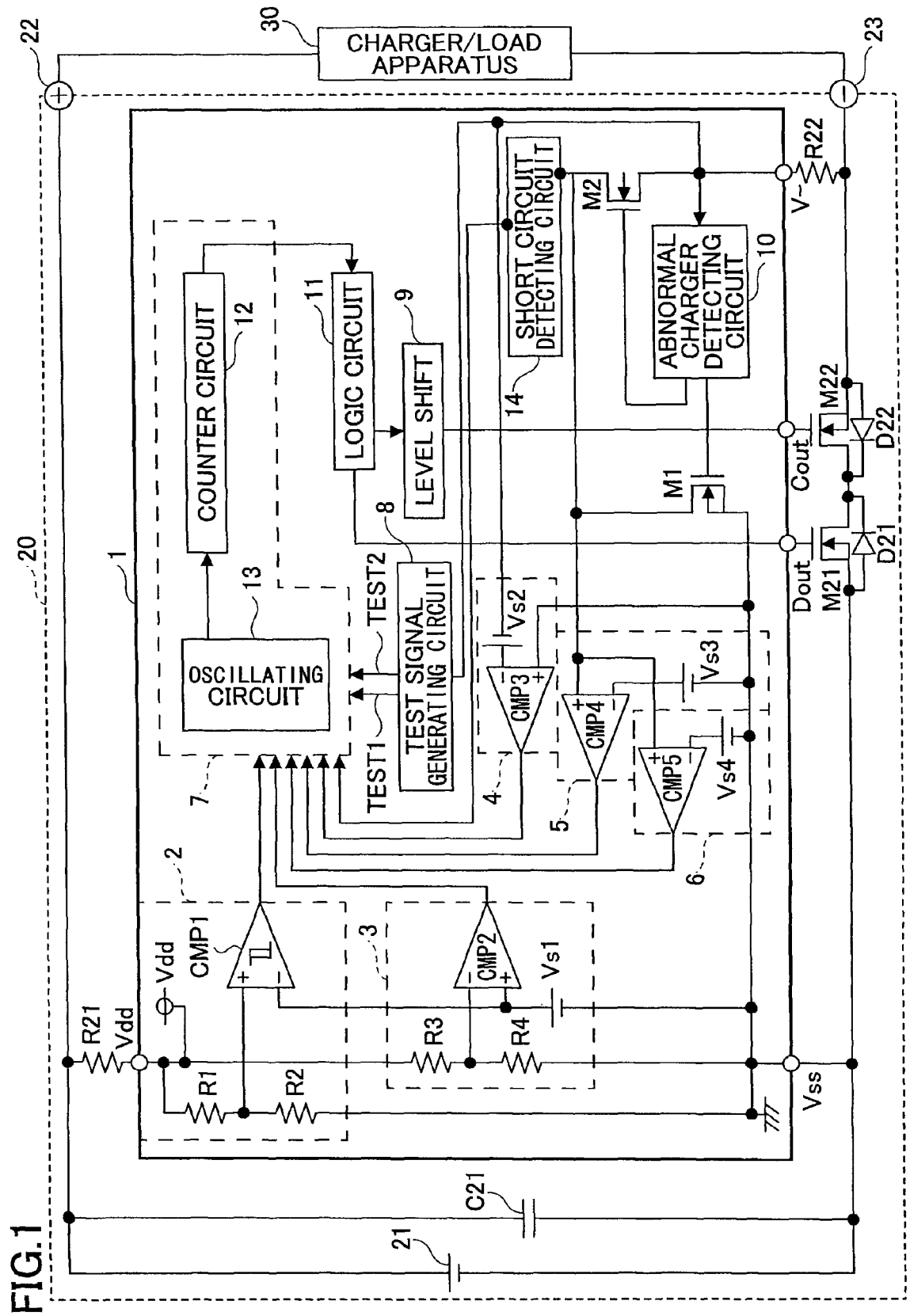
FIG. 1 shows a circuit diagram of a battery pack showing an embodiment of the present invention.

1: a semiconductor unit for a protecting secondary battery;
2: an overcharge detecting circuit;
3: an overdischarge detecting circuit;
4: a charging overcurrent detecting circuit;
5: a first discharging overcurrent detecting circuit;
6: a second discharging overcurrent detecting circuit;
7: a delay circuit;
8: a test signal generating circuit;
9: a level shift;
10: an abnormal charger detecting circuit;
11: a logic circuit;
12: a counter circuit;
13: an oscillating circuit;
14: a short circuit detecting circuit;
20: a battery pack
21: a secondary battery;
22: a plus-side terminal;
23: a minus-side terminal;
30: a charger or a load apparatus;
31, 32, 41, 42, 43, 44, 45: inverter circuits;
33: a negative-logic AND circuit;
35, 36: clamping circuits;
51, 52: NAND circuits;
I1 through I4: constant current sources;
M1, M2, M31, M33: PMOS transistors;
M21, M22, M32, M34: NMOS transistors;
R1 through R4, R21, R22, R31 through R34: resistors;
Vr: a reference voltage

BEST MODE FOR CARRYING OUT THE PRESENT INVENTION

According to an embodiment of the present invention, the following configurations are provided:

a) A semiconductor unit for protecting a secondary battery by detecting overcharge, overdischarge, charging overcurrent, discharging overcurrent or short circuit current, has a current detecting terminal converting a charging current to a negative voltage with respect to a negative electrode potential (ground potential) of the secondary battery when the secondary battery is charged, converting the discharging current to a positive voltage with respect to the negative electrode potential of the secondary battery when the secondary battery is discharged, and detecting the charging/discharging current; and a test signal generating circuit generating a first test signal when the voltage of the current detecting terminal lowers to a first negative voltage which does not occur in a normal operation state of the semiconductor unit, and generating a second test signal when the voltage of the current detecting terminal lowers to a second negative voltage lower than the first negative voltage.

In this configuration, the two test signals, i.e., the first test signal and the second test signal are generated from the values of the negative voltage applied to the current detecting terminal V−. As a result, it is possible to carry out different two tests without newly adding terminals for the testing.

b) The semiconductor unit may further have a delay circuit delaying an output of detecting the overcharge, overdischarge, charging overcurrent, discharging overcurrent or short circuit current, by a delay time, which may be determined for each detecting item, wherein either one of the first test signal and the second test signal may be used as a signal for shortening the delay time generated by the delay circuit when the semiconductor unit is tested; and as a signal for testing the delay circuit, the other one of the first test signal and the second test signal may be used.

In this configuration, one of the test signals is used for a test in which the delay time is reduced, and, the other of the test signals is used to carry out a test of the delay circuit. As a result, it is possible to carry out a test of the delay circuit itself without adding a test terminal.

c) In the semiconductor unit as mentioned in a) or b), the test signal generating circuit at least may have a first inverter circuit of a CMOS configuration in which, for the purpose of generating the first test signal, a negative power supply terminal thereof may be connected to the current detecting terminal, and an input terminal thereof may be connected to the ground potential or a predetermined potential; and a second inverter circuit of a CMOS configuration in which, for the purpose of generating the second test signal, a negative power supply terminal thereof may be connected to the current detecting terminal, and an input terminal thereof may be connected to the ground potential or a predetermined potential. Further, such a configuration may be made that an input threshold voltage of the first inverter circuit and an input threshold voltage of the second inverter circuit may be made different from one another.

In this configuration, the test signal generating circuit uses the two inverter circuits, the voltage of the current detecting terminal is applied to the negative power supply terminals of the inverter circuits, and also, the input threshold voltages of these inverter circuits are made different from one another. Thus it is possible to simplify the circuit configuration, and thus, it is possible to avoid increase in the circuit size, to achieve the purpose of the present invention.

d) In the semiconductor unit as mentioned in c), the input threshold voltage of each of the first and second inverter circuits may be set in the different voltage from one another as a result of gate threshold voltages of NMOS transistors having gates connected to the input terminal of the first and second inverter circuits being made different therebetween.

In this configuration, in order to make the input threshold voltages different between the first and second inverter circuits, the gate threshold voltages of the NMOS transistors are made different therebetween. Thus it is possible to simplify the circuit configuration, and thus, it is possible to avoid increase in the circuit size, to achieve the object of the present invention.

e) In the semiconductor unit as mentioned in d), the gate threshold voltages of the NMOS transistors having the gates connected to the input terminals of the first and second inverter circuits may be made different from one another as a result of ratios between gate widths and gate lengths of the respective NMOS transistors being made different between the first and second inverter circuits. Alternatively, in the semiconductor unit as mentioned in c), the input threshold voltages of the first and second inverter circuits may be set in the different voltages from one another as a result of resistors having different resistance values being inserted between sources of NMOS transistors having gates connected to the input terminals of the first and second inverter circuits, and the current detecting terminal.

In this configuration, in order to make the input threshold voltages different from one another, the gate threshold voltages of the NMOS transistors are made different from one another, or the resistors having the different resistance values are inserted between the sources of the NMOS transistors and the current detecting terminal. Thus it is possible to simplify the circuit configuration, and thus, it is possible to avoid increase in the circuit size, to achieve the object of the present invention.

f) In the semiconductor unit as mentioned in any one of c) through e), the input terminals of the first and second inverter circuits may be connected to a common potential. Further, in the semiconductor unit, the common potential may be the ground potential.

In this configuration, the input terminals of the first and second inverter circuits are connected to a common potential, and the common potential is the ground potential. Thus it is possible to simplify the circuit configuration, to achieve the object of the present invention.

g) In the semiconductor unit as mentioned in c), the input terminals of the first and second inverter circuits are connected to different potentials respectively.

In this configuration, the input terminals of the first and second inverter circuits are connected to different potentials respectively. As a result, the two test signals can be generated even from the inverter circuits themselves having the same input threshold voltages. Thus it is possible to simplify the circuit configuration, and thus, it is possible to avoid increase in the circuit size, to achieve the object of the present invention.

h) In the semiconductor unit as mentioned in c), a hysteresis may be given to the input threshold voltage of each of the first and second inverter circuits.

In this configuration, it is possible to avoid generation of noise such as chattering or such.

i) A battery pack has the semiconductor unit mentioned in any one of a) through h) built-in.

In this configuration, with the use of the above-mentioned semiconductor unit for protecting the secondary battery having the simple circuit configuration, it is possible to achieve a convenience battery pack.

j) An electronic apparatus uses the battery pack mentioned in i).

In this configuration, with the use of the above-mentioned semiconductor unit for protecting the secondary battery having the simple circuit configuration, it is possible to achieve a convenience electronic apparatus.

Below, with reference to figures, embodiments of the present invention will be described in detail. First, a basic configuration of a battery pack illustrating an embodiment of the present invention will be described.

FIG. 1 shows a circuit diagram of the battery pack illustrating the embodiment of the present invention.

As shown in FIG. 1, the battery pack 20 has a semiconductor unit 1 for protecting a secondary battery, the secondary battery 21, a discharge control NMOS transistor M21, a charge control NMOS transistor M22, a capacitor C1 and resistors R21, R22. The battery pack 20 has a plus-side (i.e., positive-side) terminal 22 and a minus-side (i.e., negative-side) terminal 23, to which a charger 30 (when the secondary battery 21 is charged thereby) or a load circuit 30 (when power is supplied thereto from the secondary battery 21) is connected.

The semiconductor unit 1 has a charging overcurrent detecting circuit 4, a first discharging overcurrent detecting circuit 5, a second discharging overcurrent detecting circuit 6, a delay circuit 7 which includes an oscillating circuit 13 and a counter circuit 12, a test signal generating circuit 6, a level shift 9, an abnormal charger detecting circuit 10, a logic circuit 11, NMOS transistors M1, M2, and a short circuit detecting circuit 14. The semiconductor unit 1 has a discharge control terminal Dout for controlling the discharge control NMOS transistor M21, a charge control terminal Cout for controlling the charge control NMOS transistor M22, and a current detecting terminal V− for converting a charging current and a discharging current into respective voltages, and detecting them.

It is noted that, in the circuit configuration shown in FIG. 1, upon charging of the secondary battery 21, a charging current flows in such a direction as that from the negative electrode of the secondary battery 21 through the current detecting terminal V−, while, upon discharging, a discharging current flows in a reverse direction from the current detecting terminal V− through the negative electrode of the secondary battery 21. As shown in FIG. 1, the discharge control NMOS transistor M21 and the charge control NMOS transistor M22 are connected between the negative electrode of the secondary battery 21 and the current detecting terminal V−. The charging/discharging current can flow as mentioned above when these transistors M21 and M22 are turned on. During these transistors M21 and M22 being thus turned on, turn-on resistances thereof exist. Upon charging, the charging current flows as mentioned above because the voltage of the negative electrode of the secondary battery 21 is higher than the voltage of the current detecting terminal V−. On the other hand, upon discharging, the discharging current flows as mentioned above because the voltage of the current detecting terminal V− is higher than voltage of the negative electrode of the secondary battery 21. Thus, upon charging of the secondary battery 21, the current detecting terminal V− has a negative voltage with respect to the negative electrode potential of the secondary battery 21, while, upon discharging of secondary battery 21, the current detecting terminal V− has a positive voltage with respect to the negative electrode potential of the secondary battery 21.

The battery pack 20 is used for various electronic apparatuses such as a cellular phone, a notebook computer, a PDA, and so forth. In the battery pack 20, the semiconductor unit 1 detects overcharge, overdischarge, overcurrent or such of the secondary battery 21, to protect the secondary battery 21 from overcharge, overdischarge, overcurrent and so forth.

For example, overcharge, overdischarge or short circuit is detected by the corresponding one of the overcharge detecting circuit 2, the overdischarge detecting circuit 3 and the short circuit detecting circuit 14, the oscillating circuit 13 in the delay circuit 7 starts operation, and the counter circuit 12 starts.

Thus, a delay time previously set for each of these detecting circuits 2, 3 and 14 is measured by the counter circuit 12. After the delay time has elapsed and thus, the counter circuit 12 outputs a signal to the logic circuit 11, the logic circuit 11 and the level shift 9 cause an output to the terminal Cout to have a low level when overcharge has occurred, resulting in the charge control NMOS transistor M22 being turned off, and cause an output to the terminal Dout when overdischarge or short circuit has occurred, resulting in the discharge control NMOS transistor M21 being turned off. Thus, the overcharge, the overdischarge or the shirt circuit is controlled and, the secondary battery 21 is protected from overcharge, overdischarge and shirt circuit.

It is noted that, a specific configuration for achieving the above-mentioned function that the delay time previously set for each of these detecting circuits 2, 3 and 14 is measured by the counter circuit 12 will now be described. That is, in a configuration of the counter 12 shown in FIG. 7, respective outputs of predetermined ones selected from among the flip-flop circuits FF1 through FFn may be used for measuring the delay times corresponding to these detecting circuits, respectively. That is, for measuring a shorter delay time, the output of the flip-flop circuit in the earlier stage may be used, while, for measuring a longer delay time, the output of the flop-flip circuit in the later stage may be used.

Further, when a charger in an abnormal state is connected and thereby an abnormally high voltage is applied to the battery pack 20, the abnormal charger detecting circuit 10 turns off the NMOS transistor M2 so as to prevent a potential of the current detecting terminal V− from being directly applied to the inputs of the first discharging overcurrent detecting circuit 5, the second discharging overcurrent detecting circuit 6 and the short circuit detecting circuit 14, and, also, turns on the NMOS transistor M1 to fix the input level to the ground level. Thus, shifts in an overcurrent detection voltage value and a short circuit detection voltage are prevented from occurring, due to variations in Vth of the transistors with time.

Below, a part concerning the present invention will be described in detail.

The delay circuit 7 has the oscillating circuit 13 and the counter circuit 12 as mentioned above. To the delay circuit 7, outputs of the overcharge detecting circuit 2, the overdischarge detecting circuit 3, the charging overcurrent detecting circuit 4, the first discharging overcurrent detecting circuit 5, the second discharging overcurrent detecting circuit 6 and the short circuit detecting circuit 14 are input. Further, the first test signal TEST1 and the second test signal TEST2 are input thereto from the test signal generating circuit 8, which will be described later.

Figure 7:
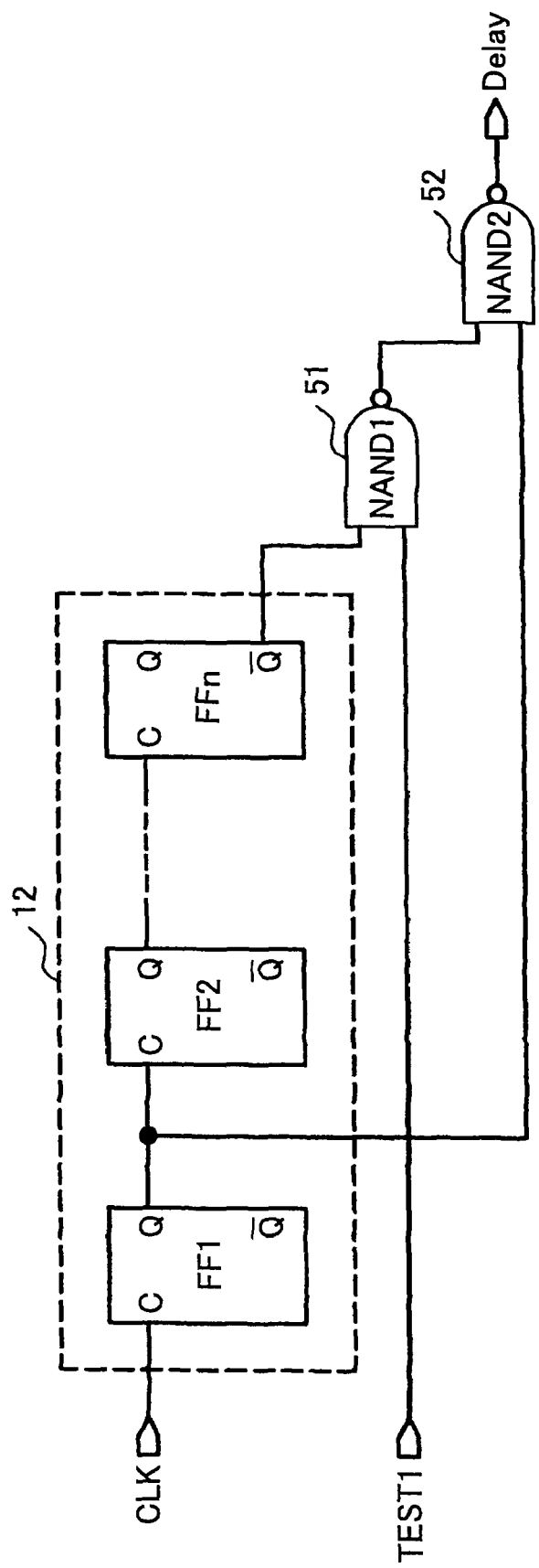
FIG. 7 shows one example of a counter circuit applicable to the embodiments of the present invention.

FIG. 7 shows one embodiment of the counter circuit 12. The counter circuit 12 has a configuration in which a plurality of flip-flop circuits FF1 through FFn are connected in a cascade manner, inputs thereto a clock signal 'CLK' and generates a delay signal 'Delay'. In regular operation (i.e., when the first test signal TEST1 is in a high level, i.e., non-active in the negative logic), a time required for an output of the flip-flop circuit FFn in the last stage or the flip-flop circuit in a predetermined stage being inverted is used as a delay time signal. During an occasion of testing the semiconductor unit 1 (i.e., when the first test signal TEST1 is in a low level, i.e., active in the negative logic), a time required for the flip-flop circuit FF1 in the first stage being inverted is used as the delay time signal. Thus, during the occasion of testing the semiconductor unit 1, the delay time can be remarkably shortened since the number of flip-flop circuits to be actually used to generate the delay time signal is thus reduced.

Figure 8:
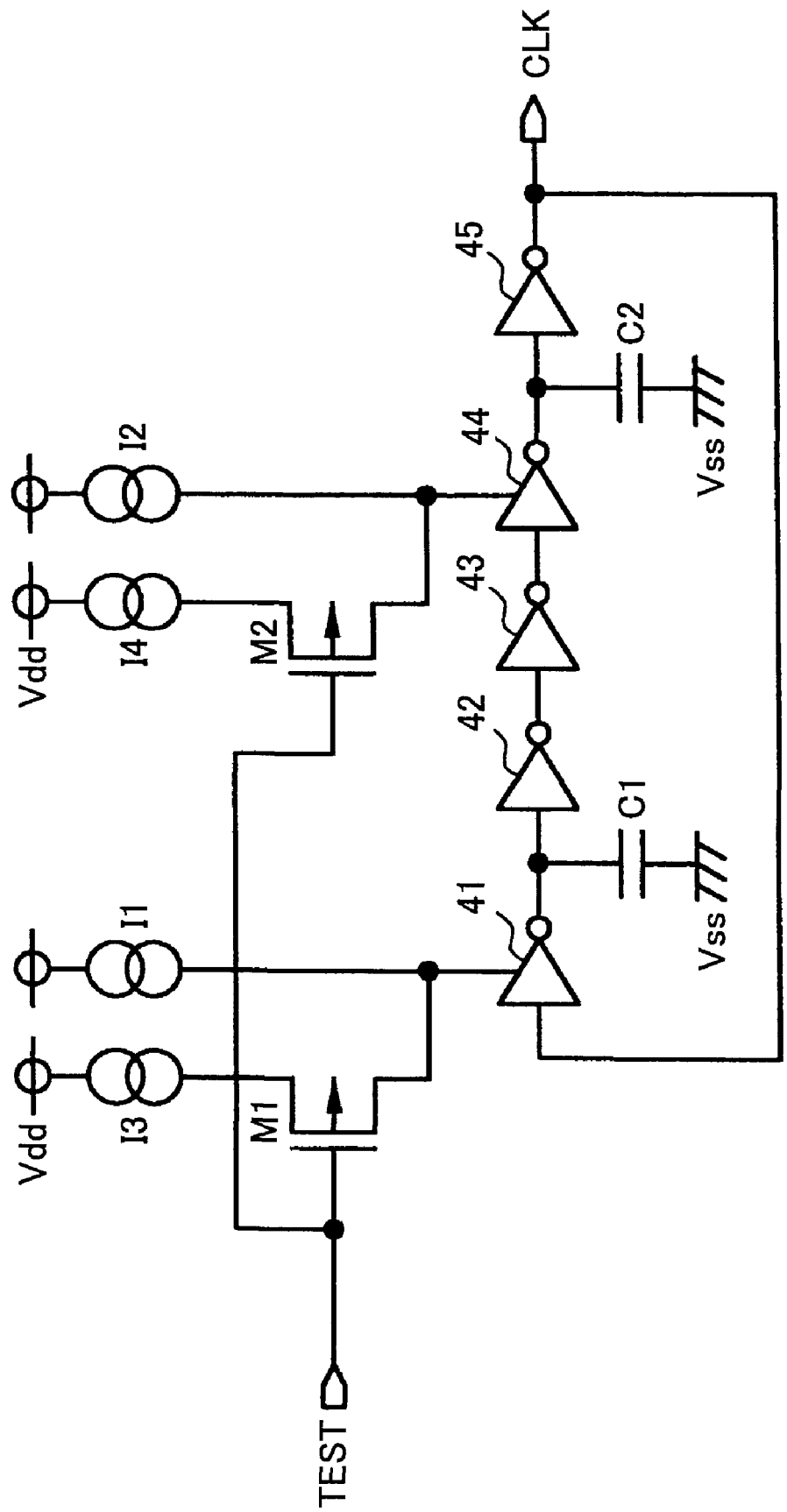
FIG. 8 shows one example of an oscillating circuit applicable to the embodiments of the present invention.

FIG. 8 shows one example of the oscillating circuit 13 for generating the clock signal 'CLK', which is input to the counter circuit 12. In regular operation (i.e., when the second test signal TEST2 is in the high level (non-active)), the oscillation frequency is low. On the other hand, during the occasion of testing the delay circuit 7 particularly (i.e., when the second test signal TEST2 is in the low level (active)), the oscillation frequency is increased.

Thus, as described in the BACKGROUND ART, when the entire semiconductor unit 1 including the delay circuit (including the counter circuit 12 and the oscillating circuit 13) is tested, the first test signal TEST1 may be made active (i.e., to have the low level) with the second test signal TEST2 non-active (i.e., to have a high level), while, when particularly the delay circuit (including the counter circuit 12 and the oscillating circuit 13) is tested, the second test signal TEST2 may be made active (i.e., to have the low level) with the first test signal TEST1 non-active (i.e., to have the high level).

Thereby, when the entire semiconductor unit 1 is tested, the oscillating circuit 13 operates with the normal oscillation frequency, and the counter circuit 12 generates the shortened delay time as a result of the output of the flip-flop circuit in the first stage or the predetermined stage close thereto being used as mentioned above. On the other hand, when particularly the delay circuit is tested, the oscillating circuit 13 operates with the increased oscillation frequency as a result of the charging/discharging currents being increased as mentioned above, and the counter circuit 12 uses the output of the flip-flop circuit in the last stage or the predetermined stage as mentioned above whereby all the flip-flop circuits FF1 through FFn can be tested at once in this case.

Figure 2:
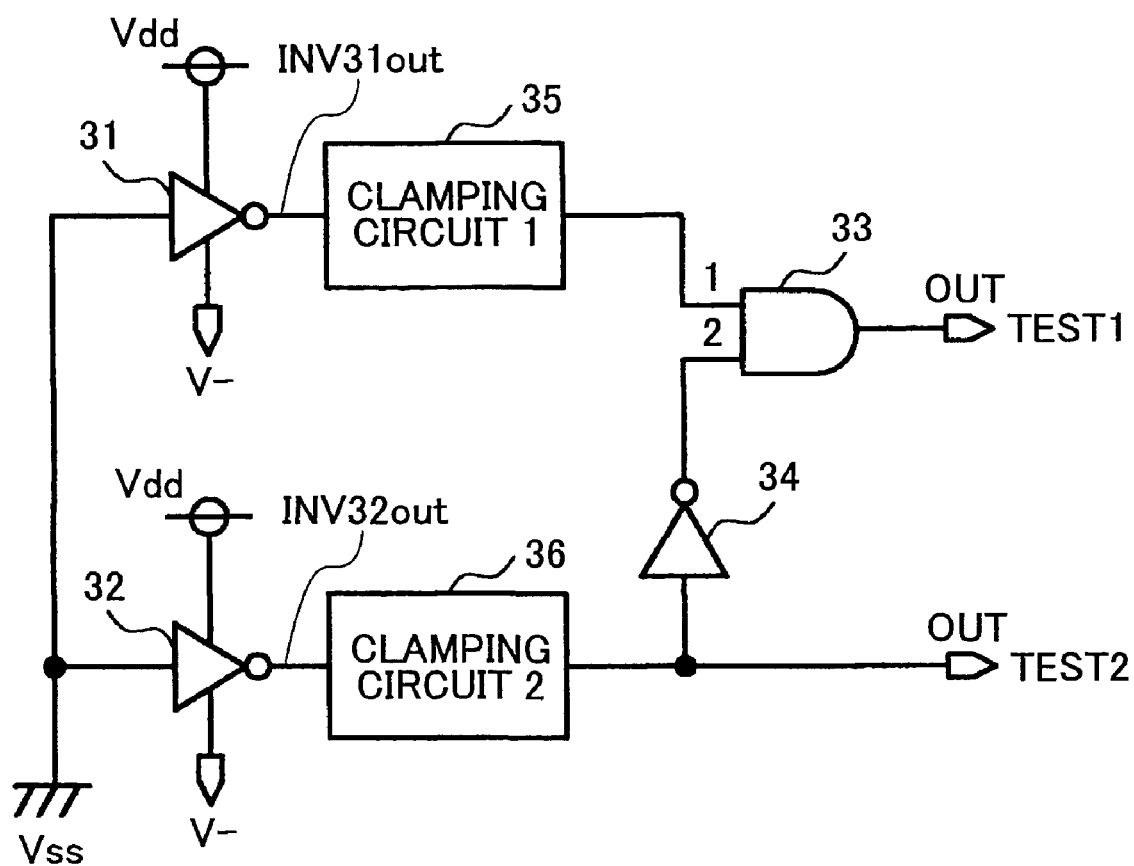
FIG. 2 shows a block diagram of a test signal generating circuit 8 in a first embodiment of the present invention.

FIG. 2 shows a block diagram of the test signal generating circuit 8 in a first embodiment of the present invention.

The test signal generating circuit 8 outputs the first test signal TEST1 (i.e., signal level of the corresponding output terminal TEST1 comes to have a low level) when the voltage of the current detecting terminal V− lowers to a first negative voltage with respect to the ground potential Vss, while, it outputs the second test signal TEST2 (i.e., signal level of the corresponding output terminal TEST2 comes to have a low level) when the voltage of the current detecting terminal V− lowers to a second negative voltage which is further lower than the first negative voltage. As shown in FIG. 2, the test signal generating circuit 8 includes inverter circuits 31 and 32 made of CMOS transistors, clamping circuits 35 and 36, a negative-logic AND circuit 33 and an inverter circuit 34.

The positive-side power supply terminals of the inverter circuits 31 and 32 are both connected to a power source potential Vdd, and the negative-side power supply terminals thereof are both connected to the current detecting terminal V−, as shown in FIG. 2. Further, the input terminals of these inverter circuits 31 and 32 are both connected to the ground potential Vss.

The input threshold voltage of the inverter circuit 31 is set lower than the input threshold voltage of the inverter circuit 32.

Figure 3:
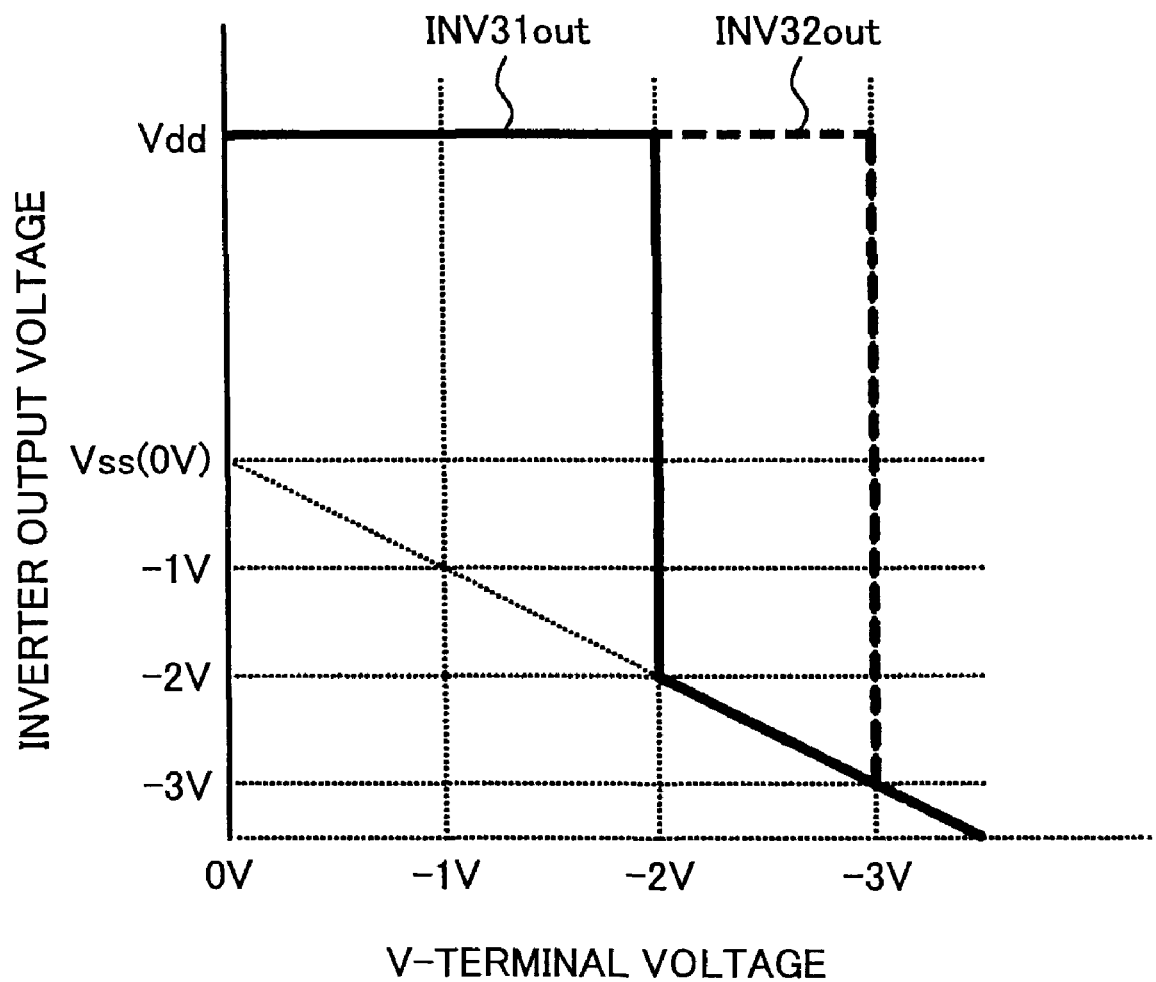
FIG. 3 shows a graph showing a relationship between an output voltage of an inverter circuit shown in FIG. 2 and a voltage of a negative-side power supply terminal (i.e., of a current detecting terminal V−)

FIG. 3 shows a graph showing a relationship between output voltages of the inverter circuits 31 and 32, and voltages of the negative-side power supply terminals (i.e., the voltage of the current detecting terminal V−). When the voltage of the current detecting circuit V− is the ground potential Vss (i.e., 0 V), the output voltage INV31out of the inverter circuit 31 and the output voltage INV32out of the inverter circuit 32 are both in high levels, and are the power source potential Vdd, as shown in FIG. 3.

When the voltage of the current detecting terminal V− is then reduced to come to be the first negative voltage (for example, −2 V), the inverter circuit 31 is inverted, and thus, the output voltage INV31out thereof falls to −2 V. When the voltage of the current detecting terminal V− further lowers to be the second negative voltage (for example, −3 V), the inverter circuit 32 is also inverted, and thus, the output INV32out thereof falls to −3 V, as shown.

It is noted that, as mentioned above, the input threshold voltage of the inverter circuit 31 is set lower than the input threshold voltage of the inverter circuit 32. This means that a voltage to be applied between the input terminal and the negative power source terminal (which is connected to the current detecting terminal V− as shown in FIG. 2) to invert is smaller for the inverter circuit 31 than that for the inverter circuit 32. The voltage between the input terminal and the negative power source terminal in each of the inverter circuits 31 and 32 is equal to the voltage between the ground potential Vss and the voltage of the current detecting terminal V− since the input of each inverter circuit is connected to the ground potential Vss as shown in FIG. 2. As a result, as shown in FIG. 3, the inverter circuit 32 is inverted when the voltage of the current detecting terminal V− is reduced to the second negative voltage (i.e., the input threshold voltage of the inverter circuit 32) which is lower than the first negative voltage (i.e., the input threshold voltage of the inverter circuit 31) at which the inverter circuit 31 has been already inverted.

The clamping circuit 1 (35) and the clamping circuit 2 (36) are provided to clamp the outputs of the inverter circuits 31 and 32 to 0 V when the outputs of the inverter circuits 31 and 32 are in low levels which are lower than 0 V as shown in FIG. 3. The output of the camping circuit 1 (35) is applied to an input 1 of the negative-logic AND circuit 33. The output of the claiming circuit 2 (36) is output, as it is, as the second test signal TEST2, and also, is connected to an input 2 of the negative-logic AND circuit 33 via the inverter circuit 34 which inverts the level of the output of the clamping circuit 2 (36).

It is noted that, for the negative-logic AND circuit 33, the negative logic is applied, and thus, a high level is regarded as "0" while, a low level is regarded as "1". As a result, when the input 2 of the negative-logic AND circuit 33 is in the low level, which is regarded as "1", the other input 1 is output therefrom as it is. In contrast thereto, in the negative-logic AND circuit 33, when the input 2 is in the high level, which is regarded as "0", the output thereof is always "0", i.e., the high level.

As a result, when the second test signal TEST2 is in the high level (non-active in the negative logic), it is then inverted by the inverter circuit 34 into the low level, which is regarded as "1" by the negative-logic AND circuit 33. As a result, "1" is input to the input 2 of the negative-logic AND circuit 33, and as a result, the negative-logic AND circuit 33 outputs the signal level of the input 1, as it is, and thus, the first test signal TEST1 is the output of the clamping circuit 1 (35), which clamps the output of the inverter circuit 31. Thus, when the second test signal TEST2 is in the high level (non-active), the output of the inverter circuit 31 is output, as it is (strictly speaking, after being processed by the clamping circuit 1 (35)), as the first test signal TEST1 from the test signal generating circuit 8. On the other hand, when the second test signal TEST2 is in the low level (active), it is inverted by the inverter circuit 34 to be the high level, which is regarded as "0" by the negative-logic AND circuit 33. As a result, the negative-logic AND circuit 33 outputs "0", which is the high level (i.e., non-active) in the negative logic. Thus, when the second signal TEST2 is in the low level (active), the first test signal TEST1 output from the test signal generating circuit 8 is always in the high level (non-active).

Thus, in order to output the first test signal TEST1, that is, in order that the output terminal TEST1 of the test signal generating circuit 8 has the low level (active), the voltage of the current detecting terminal V− should be set between the first negative voltage (i.e., −2 V) and the second negative voltage (i.e., −3 V). Thereby, as shown in FIG. 3, the output INV32out of the inverter circuit 32 is in the high level while the output INV31out of the inverter 31 is in the low level. In this state, as mentioned above, the high-level output of the inverter 32 is inverted by the inverter 34, to be in the low level, which is regarded as "1", and as a result, the output INV31out is output as it is, as the first test signal TEST1. Since the output INV31out of the inverter 31 is in the low level as mentioned above, the low level, which is regarded as "1" (active) in the negative logic, is output as the first test signal TEST1, via the clamping circuit 1 (35).

On the other hand, in order to output the second test signal TEST2, that is, in order that the output terminal TEST2 of the test signal generating circuit 8 has the low level (active), which is regarded as "1" in the negative logic, the voltage of the current detecting terminal V− should be set lower than the second negative voltage (i.e., −3 V). Thereby, as shown in FIG. 3, both the output INV32out of the inverter circuit 32 and the output INV31out of the inverter 31 are in the low level. In this state, as mentioned above, the low-level output of the inverter 32 is inverted by the inverter 34, to be in the high level, which is regarded as "0", and as a result, the first test signal TEST1 is in the high level (non-active), which is regarded as "0" in the negative logic. Since the output INV32out of the inverter 32 is in the low level as mentioned above, the low level (active), which is regarded as "1" in the negative logic, is output as the second test signal TEST2 via the clamping circuit 2 (36).

Figure 4:
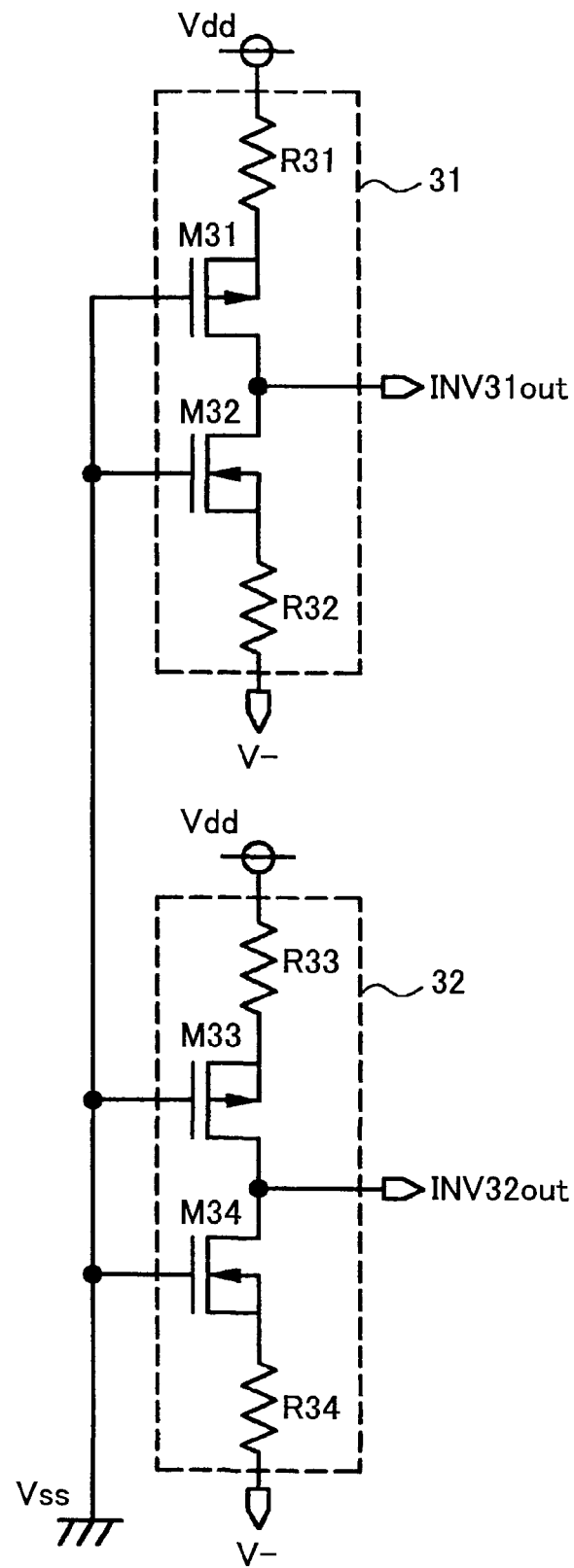
FIG. 4 shows a detailed circuit diagram of inverter circuits 31 and 32 shown in FIG. 2.

FIG. 4 shows a detailed circuit diagram of examples of the inverter circuits 31 and 32 shown in FIG. 2. The inverter circuit 31 includes a PMOS transistor M31, an NMOS transistor M32 and resistors R31 and R32. The inverter circuit 32 includes a PMOS transistor M33, an NMOS transistor M34 and resistors R33 and R34.

The source of the PMOS transistor M31 is connected to the power source potential Vdd via the resistor R31, and the drain thereof is connected to the drain of the NMOS transistor M32. The source of the NMOS transistor M32 is connected to the ground potential Vss via the resistor R32. Further, the gate of the PMOS transistor M31 and the gate of the NMOS transistor M32 are connected together, and, are connected to the ground potential Vss. The output INV31out of the inverter circuit 31 is taken from the node at which the drain of the PMOS transistor M31 and the drain of the NMOS transistor M32 are connected together.

A configuration of the inverter circuit 32 is the same as that of the inverter circuit 31 described above, and thus, duplicate description is omitted. In order to make the input threshold voltages of the inverter circuit 31 and the inverter circuit 32 different from one another as mentioned above, the respective resistance values of the resistors R32 and R34 are made different from one another in the examples.

As the resistance value of the resistor R32 or R34 is increased, a voltage drop generated by the resistor increases accordingly, and thus, the source potential of the corresponding one of the NMOS transistor M32 and M34 is lifted. As a result, the input threshold voltage of the corresponding inverter circuit increases. In the present embodiment, the input threshold voltage of the inverter circuit 32 is set higher as mentioned above. Therefore, the resistance value of the resistor R34 is made larger than that of the resistor R32.

Another example (a variant embodiment of the first embodiment described above) of the method of making the input threshold voltages of the inverter circuits 31 and 32 different from one another is described below. That is, instead of making the resistance values different from one another as mentioned above, the gate threshold voltages of the NMOS transistors M32 and M34 may be made different from one another. The gate threshold voltages can be made different from one another as a result of ratios (W/L) between the gate widths (W) and the gate lengths (L) being made different between the NMOS transistors M32 and M34. Thus, it is possible to making the input threshold voltages of the inverter circuits 31 and 32 from one another accordingly also in this case.

Specifically, as the above-mentioned ratio W/L of an NMOS transistor is increased, a current flowing through the transistor increases accordingly as well-known. As a result, the transistor is less likely to be turned off during it being turned on, while, during it being turned off, it is more likely to be turned on. As result, as the above-mentioned ratio W/L of the NMOS transistor is increased, the gate threshold voltage of the transistor lowers accordingly. In this embodiment, the inverter circuit 31 should have the reduced input threshold voltage, and for this purpose, the above-mentioned ratio W/L of the NMOS transistor M32 thereof should be made larger than that of the NMOS transistor M34 of the other inverter circuit 32.

Figure 5:
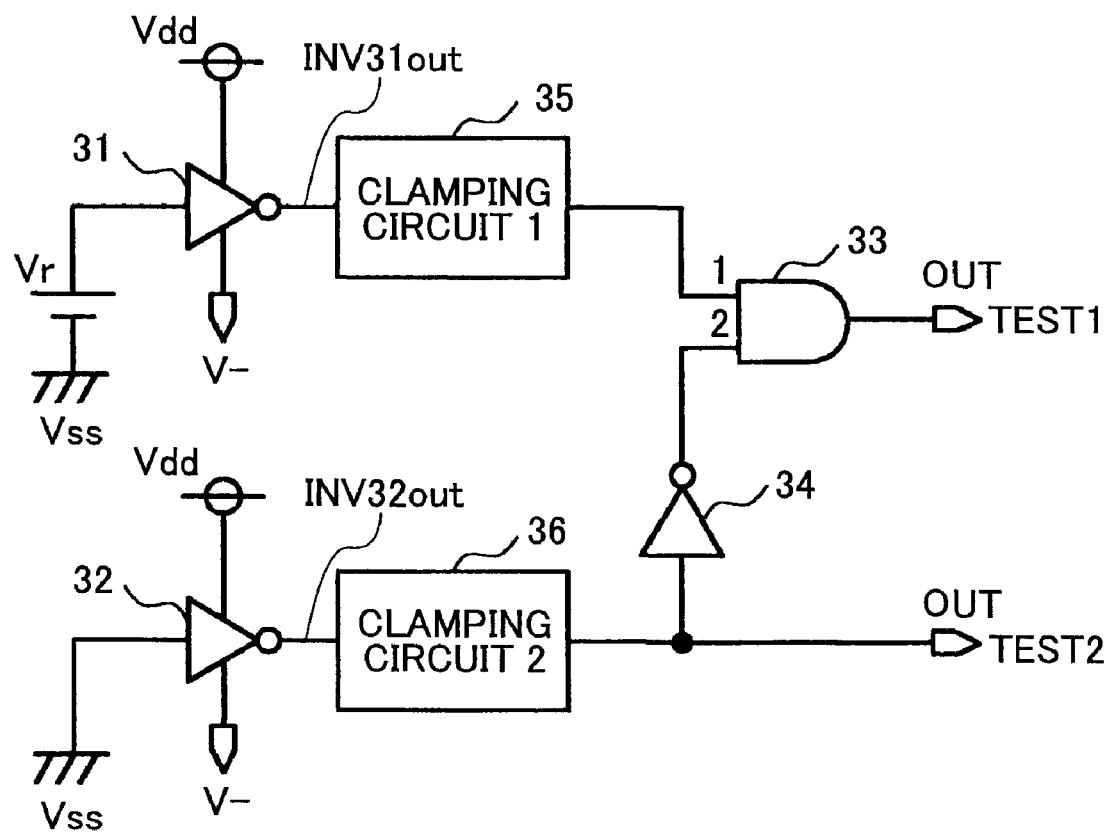
FIG. 5 shows a block diagram of a test signal generating circuit 8 in a second embodiment of the present invention.
Figure 6:
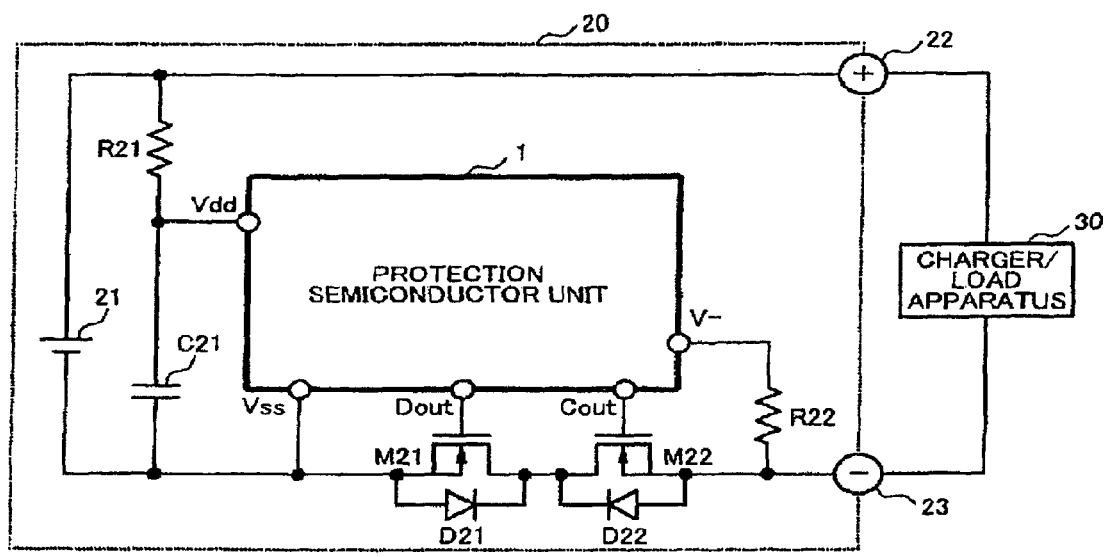
FIG. 6 shows a block diagram of a battery pack in the related art.

FIG. 5 shows a block diagram of the test signal generating circuit 8 in a second embodiment of the present invention. The second embodiment is different from the first embodiment described above, in that a reference voltage Vr is applied to the input of the inverter circuit 31.

In the circuit configuration of FIG. 5, even when the input threshold voltages of the inverter circuits 31 and 32 are the same as one another, the inverter circuit 31 is inverted earlier than the inverter circuit 32 when the voltage of the current detecting terminal V− is gradually reduced, as shown in FIG. 3. As a result, it is possible to provide the same function as that of the circuit configuration of FIG. 2 in the first embodiment.

It is noted that, it is preferable to provide a hysteresis voltage to the input threshold voltages of the inverter circuits 31 and 32, shown in FIGS. 2 through 5. Thereby, it is possible to avoid generation of noise such as chattering or such, when the test signals are generated.

Figure 9:
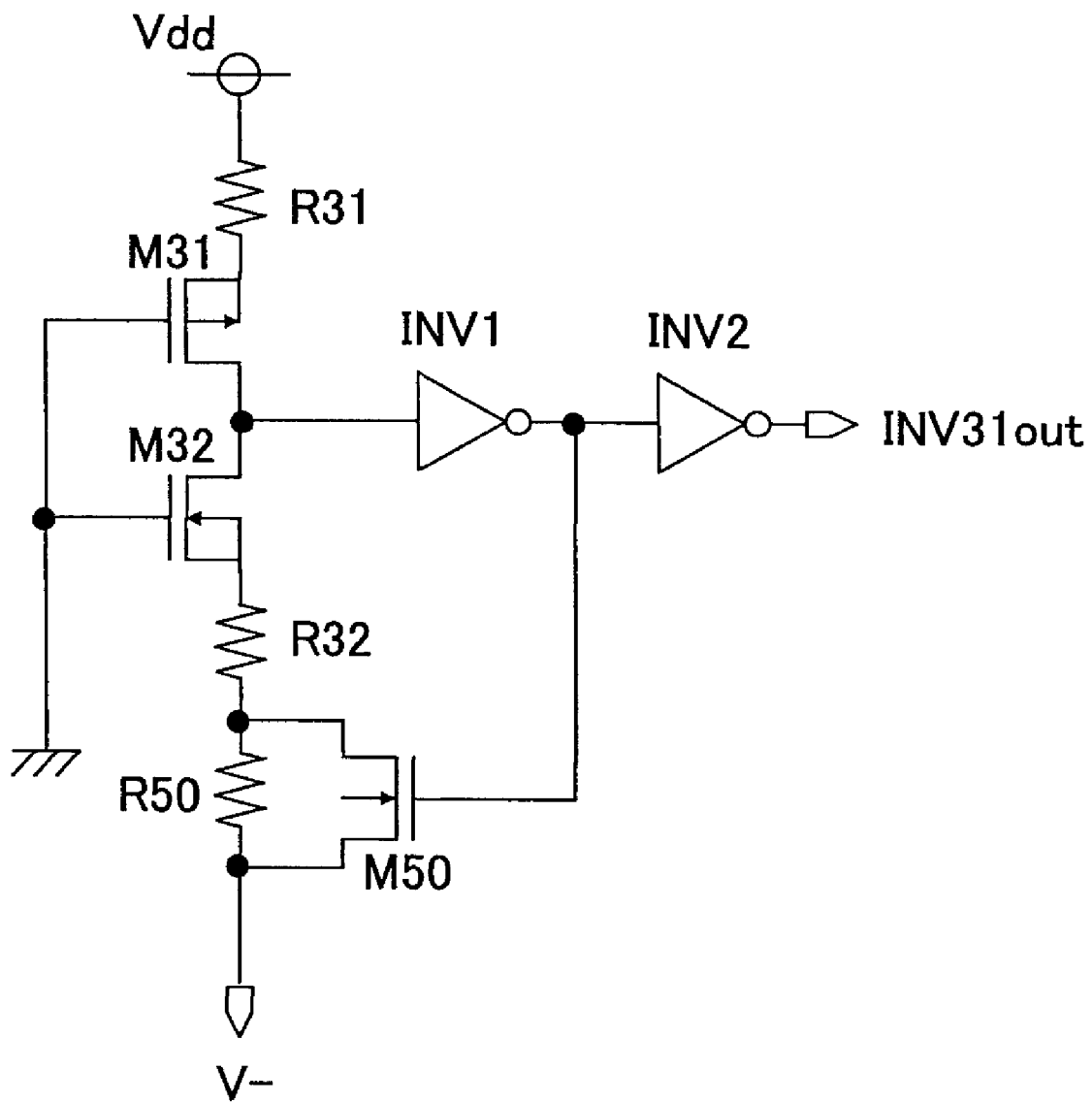
FIG. 9 shows one example of providing a hysteresis voltage as an embodiment of the present invention.

FIG. 9 shows one example of providing a hysteresis voltage to the input threshold violates of the inverter circuit 31 and 32. FIG. 9 only shows the example of the inverter circuit 31 as a typical one. In this configuration, a resistor R50, an NMOS transistor M50 and inverter circuits INV1, INV2 are additionally provided. As a result, when the voltage of the current detecting terminal V− is reduced gradually, the potential between the transistors M31 and M32 is first in a high level, whereby the a low level after being inverted by the inverter circuit INV1 is applied to the gate of the NMOS transistor M50, which is then turned off accordingly. As a result, the resistor R50 lifts the source potential of the NMOS transistor M32, and thereby, the threshold voltage increases accordingly. On the other hand, when the voltage of the current detecting terminal V− is increased gradually, the potential between the transistors M31 and M32 is first in a low level, whereby the a high level after being inverted by the inverter circuit INV1 is applied to the gate of the NMOS transistor M50, which is then turned on accordingly. As a result, the resistor R50 is bypassed by the turned-on NMOS transistor M50, and thereby, the threshold voltage lowers accordingly. Thus, the hysteresis voltage is provided.

Figure 10:
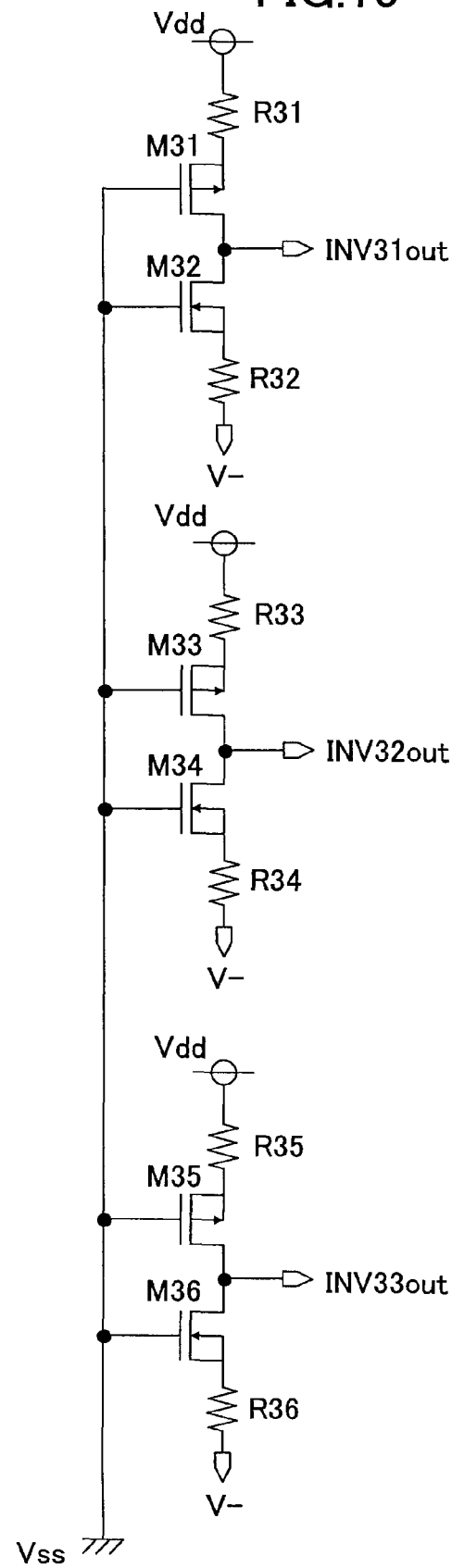
FIG. 10 shows one example of increasing the number of test signals as an embodiment of the present invention.

Further, by increasing the number of the inverter circuits 31 and 32 included in the test signal generating circuit 8, it is possible to increase the number of test signals to be generated. FIG. 10 shows a specific example thereof. In this configuration, the number of the inverter circuits is three, i.e., the inverter circuit 31, 32 and 33, as a result of the inverter circuit 33 being additionally provided. Thereby, the number of test signals can be increased from two to three.

Thus, according to the present invention, the first test signal and the second test signal are generated according to the magnitude of the negative voltage applied to the current detecting terminal V− of the semiconductor unit 1. As a result, it is possible to carry out different tests on the semiconductor unit 1 without adding new terminals for testing.

It is noted that a semiconductor unit for protecting a secondary battery such as that of the embodiments of the present invention described above and a battery pack having it built-in are, as applied technology, applicable to various electronic apparatuses requiring a secondary battery, including a cellular phone, a digital camera, an audio apparatus such as a potable MD apparatus, and so forth, which have come into wide use recently.

While the invention herein disclosed has been described by means of specific embodiments and applications thereof, numerous modifications and variations could be made thereto by those skilled in the art without departing from the scope of the invention set forth in the claims.

The present application is based on Japanese Priority Application No. 2006-247620, filed on Sep. 13, 2006, the entire contents of which are hereby incorporated herein by reference.

The invention claimed is:

1. A semiconductor unit for protecting a secondary battery by detecting overcharge, overdischarge, charging overcurrent, discharging overcurrent or short circuit current, comprising:

a current detecting terminal converting a charging current into a negative voltage with respect to a negative electrode potential (ground potential) of the secondary battery when the secondary battery is charged, converting a discharging current into a positive voltage with respect to the negative electrode potential of the secondary battery when the secondary battery is discharged and detecting the charging/discharging current; and a test signal generating circuit generating a first test signal when a voltage of the current detecting terminal is reduced to a first negative voltage which does not occur in a normal operation state of the semiconductor unit, and generating a second test signal when the voltage of the current detecting terminal is reduced to a second negative voltage which is lower than the first negative voltage, wherein the test signal generating circuit at least comprises:

a first inverter circuit of a CMOS configuration in which, for the purpose of generating the first test signal, a negative power supply terminal thereof is connected to the current detecting terminal, and an input terminal thereof is connected to a ground potential or a predetermined potential, and a second inverter circuit of a CMOS configuration in which, for the purpose of generating the second test signal, a negative power supply terminal thereof is connected to the current detecting terminal, and an input terminal thereof is connected to the ground potential or the predetermined potential.

2. The semiconductor unit as claimed in claim 1, further comprising:

a delay circuit delaying output of detecting the overcharge, overdischarge, charging overcurrent, discharging overcurrent or short circuit current, by a delay time, which is determined for each detecting item, wherein:

either one of the first test signal and the second test signal is used as a signal for shortening the delay time generated by the delay circuit, when the semiconductor unit is tested; and as a signal for testing the delay circuit, the other one of the first test signal and the second test signal is used.

3. The semiconductor unit as claimed in claim 1, wherein:
an input threshold voltage of the first inverter circuit and an input threshold voltage of the second inverter circuit are different from one another.

4. The semiconductor unit as claimed in claim 3, wherein:
the input threshold voltages of the first and second inverter circuits are set in the different voltage as a result of gate threshold voltages of NMOS transistors having gates connected to the input terminals of the first and second inverter circuits being made different therebetween.

5. The semiconductor unit as claimed in claim 4, wherein:
the gate threshold voltages of the NMOS transistors having the gates connected to the input terminals of the first and second inverter circuits are made different as a result of ratios between gate widths and gate lengths of the NMOS transistors being made different between the first and second inverter circuits.

6. The semiconductor unit as claimed in claim 3, wherein:
the input threshold voltages of the first and second inverter circuits are set in the different voltage as a result of resistors having different resistance values being inserted between sources of NMOS transistors having gates connected to the input terminals of the first and second inverter circuits, and the current detecting terminal.

7. The semiconductor unit as claimed in claim 3, wherein:
the input terminals of the first and second inverter circuits are connected to a common potential.

8. The semiconductor unit as claimed in claim 7, wherein:
the common potential is the ground potential.

9. The semiconductor unit as claimed in claim 1, wherein:
a hysteresis is given to an input threshold voltage of each of the first and second inverter circuits.

10. A battery pack having the semiconductor unit claimed in claim 1 built-in.

11. An electronic apparatus using the battery pack claimed in claim 10.

12. A semiconductor unit for protecting a secondary battery by detecting overcharge, overdischarge, charging overcurrent, discharging overcurrent or short circuit current, comprising:

a current detecting terminal converting a charging current into a negative voltage with respect to a negative electrode potential (ground potential) of the secondary battery when the secondary battery is charged, converting a discharging current into a positive voltage with respect to the negative electrode potential of the secondary battery when the secondary battery is discharged and detecting the charging/discharging current; and a test signal generating circuit generating a first test signal when a voltage of the current detecting terminal is reduced to a first negative voltage which does not occur in a normal operation state of the semiconductor unit, and generating a second test signal when the voltage of the current detecting terminal is reduced to a second negative voltage which is lower than the first negative voltage, wherein the test signal generating circuit at least comprises:

a first inverter circuit of a CMOS configuration in which, for the purpose of generating the first test signal, a negative power supply terminal thereof is connected to the current detecting terminal, and an input terminal thereof is connected to a ground potential or a predetermined potential, and a second inverter circuit of a CMOS configuration in which, for the purpose of generating the second test signal, a negative power supply terminal thereof is connected to the current detecting terminal, and an input terminal thereof is connected to a second predetermined potential, and wherein the input terminals of the first and second inverter circuits are connected to different potentials respectively.

13. A battery pack having the semiconductor as claimed in claim 12 built in.

14. An electronic apparatus using the battery claimed in claim 13.

* * * * *